(12) United States Patent
Yati

(10) Patent No.: US 11,275,361 B2
(45) Date of Patent: Mar. 15, 2022

(54) SYSTEMS AND METHODS FOR PREDICTING DEFECTS AND CRITICAL DIMENSION USING DEEP LEARNING IN THE SEMICONDUCTOR MANUFACTURING PROCESS

(71) Applicant: KLA-Tencor Corporation, Milpitas, CA (US)

(72) Inventor: Arpit Yati, Lucknow (IN)

(73) Assignee: KLA-Tencor Corporation, Milpitas, CA (US)

( * ) Notice: Subject to any disclaimer, the term of this patent is extended or adjusted under 35 U.S.C. 154(b) by 1100 days.

(21) Appl. No.: 15/814,561

(22) Filed: Nov. 16, 2017

(65) Prior Publication Data
US 2019/0004504 A1    Jan. 3, 2019

Related U.S. Application Data

(60) Provisional application No. 62/545,918, filed on Aug. 15, 2017.

(30) Foreign Application Priority Data

Jun. 30, 2017 (IN) .............................. 201741023043

(51) Int. Cl.
G05B 19/418 (2006.01)
G05B 13/02 (2006.01)

(52) U.S. Cl.
CPC ..... *G05B 19/41875* (2013.01); *G05B 13/027* (2013.01); *G05B 2219/32186* (2013.01);
(Continued)

(58) Field of Classification Search
CPC ............ G05B 19/41875; G05B 13/027; G05B 2219/32186; G05B 2219/37109; G05B 2219/37208; G05B 2219/45031
See application file for complete search history.

(56) References Cited

U.S. PATENT DOCUMENTS

| | | | | |
|---|---|---|---|---|
| 7,729,528 | B2* | 6/2010 | O'Dell | H01L 21/67271 382/149 |
| 7,937,179 | B2* | 5/2011 | Shimshi | G06F 30/3323 700/110 |
| 2008/0077907 | A1 | 3/2008 | Kulkarni | |
| 2009/0063378 | A1 | 3/2009 | Izikson | |
| 2011/0320149 | A1 | 12/2011 | Lee et al. | |
| 2013/0064442 | A1 | 3/2013 | Chang et al. | |

(Continued)

FOREIGN PATENT DOCUMENTS

| | | |
|---|---|---|
| CN | 106290378 A | 1/2017 |
| TW | 201721784 A | 6/2017 |

OTHER PUBLICATIONS

Bisschop, P. (May 31, 2016). Optical proximity correction: A cross road of data flows. https://iopscience.iop.org/. https://iopscience.iop.org/article/10.7567/JJAP.55.06GA01 (Year: 2016).*

(Continued)

*Primary Examiner* — Li Wu Chang

(74) *Attorney, Agent, or Firm* — Hodgson Russ LLP

(57) ABSTRACT

An initial inspection or critical dimension measurement can be made at various sites on a wafer. The location, design clips, process tool parameters, or other parameters can be used to train a deep learning model. The deep learning model can be validated and these results can be used to retrain the deep learning model. This process can be repeated until the predictions meet a detection accuracy threshold. The deep learning model can be used to predict new probable defect location or critical dimension failure sites.

20 Claims, 4 Drawing Sheets

(52) U.S. Cl.
CPC .............. *G05B 2219/37109* (2013.01); *G05B 2219/37208* (2013.01); *G05B 2219/45031* (2013.01)

(56) References Cited

U.S. PATENT DOCUMENTS

| | | | |
|---|---|---|---|
| 2016/0148850 A1 | 5/2016 | David | |
| 2016/0163035 A1* | 6/2016 | Chang | G06T 7/0004 382/149 |
| 2016/0313651 A1* | 10/2016 | Middlebrooks | G03F 7/705 |
| 2016/0335753 A1 | 11/2016 | Sezginer et al. | |
| 2018/0164792 A1* | 6/2018 | Lin | G05B 13/0265 |

OTHER PUBLICATIONS

Photoresist. (Nov. 5, 2018). Semiconductor Engineering. https://semiengineering.com/knowledge_centers/manufacturing/lithography/photoresist/ (Year: 2018).*

Atomic layer deposition (ALD). (Jul. 3, 2019). Semiconductor Engineering. https://semiengineering.com/knowledge_centers/manufacturing/process/deposition/atomic-layer-deposition/(Year: 2019).*

Bao, L. (Oct. 25, 2013). A hierarchical model for characterising spatial wafer variations. Taylor & Francis. https://www.tandfonline.com/doi/abs/10.1080/00207543.2013.849389 (Year: 2013).*

ISA/KR, ISR and WO for PCT/US2018/040162, Nov. 15, 2018.

Yoo, Y.K. Ryan, "Automated AFM Boosts Throughput in Automatic Defect Review", Microscopy today, Nov. 2014, pp. 18-23, vol. 22, Issue 6, Cambridge University.

Kondaveeti, Anirudh, "Case Study: Using Data Science to Detect Defects In Semiconductors", Oct. 1, 2015. URL: https://tanzu.vmware.com/content/blog/case-study-using-data-science-to-detect-defects-in-semiconductors.

Baek, Jae Yeon, "Modeling and Selection for Real-time Wafer-to-Wafer Fault Detection Applications", Doctoral dissertation, 2015, University of California, Berkeley, USA.

TIPO, First Office Action for TW Application No. 107122224, dated Jan. 22, 2022 (see X/Y/A designations at pp. 9-10).

* cited by examiner

SYSTEMS AND METHODS FOR PREDICTING DEFECTS AND CRITICAL DIMENSION USING DEEP LEARNING IN THE SEMICONDUCTOR MANUFACTURING PROCESS

CROSS-REFERENCE TO RELATED APPLICATIONS

This application claims priority to Indian Application No. 201741023043, filed Jun. 30, 2017, and U.S. Provisional Application No. 62/545,918, filed Aug. 15, 2017, the disclosures of which are incorporated herein by reference.

FIELD OF THE DISCLOSURE

The present disclosure relates to systems and methods for predicting defect sites and critical dimension measurements.

BACKGROUND OF THE DISCLOSURE

Fabricating semiconductor devices, such as logic and memory devices, typically includes processing a substrate, such as a semiconductor wafer, using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive. As such, determining which of the defects actually has an effect on the electrical parameters of the devices and the yield may allow process control methods to be focused on those defects while largely ignoring others. Furthermore, at smaller design rules, process induced failures may, in some cases, tend to be systematic. That is, process induced failures tend to fail at predetermined design patterns often repeated many times within the design. Elimination of spatially systematic, electrically relevant defects is important because eliminating such defects can have a significant overall impact on yield. Whether or not defects will affect device parameters and yield often cannot be determined from the inspection, review, and analysis processes described above since these processes may not be able to determine the position of the defect with respect to the electrical design.

Finding critical defect locations is crucial for the semiconductor manufacturing industry, especially to locate defects of interest (DOI) that are yield killers. A complex set of parameters are responsible for defect formation. Defects can be formed for many reasons and can be broadly categorized based on the root cause. These root causes include design-related issues, process-related issues, tool-related issues, and random defects. Conventional optical or electron beam inspection tools have been used to scan the critical hot spots on the wafer to locate the real defect sites.

Current defect detection methods involve finding various hot spot sites using design or shape based features. Inspection tools then visit those sites, which are then reviewed with a scanning electron microscope (SEM) to confirm defect types. This method has large nuisance rates and does not involve any direct inputs from the process tools for locating defects.

Currently, critical dimension (CD) SEM tools only measure CD data at particular sites, which may not provide useful information about the CD variations across the wafer. Moreover, the data points are typically too infrequent to make any meaningful projections.

These current techniques do not involve a comprehensive set of equations to define the formation of defects. These current techniques also lead to a high nuisance rate during defect detection and cannot predict defect sites using the known locations. Furthermore, there is no way to predict CD measurements or generate high resolution wafer map due to the lack of comprehensive CD data on a wafer. Electron beam based CD measurement tools are slow and cover only a small portion of a wafer for CD data due to throughput constraints.

A new technique and system to predict defect detection and critical dimension measurements is needed.

BRIEF SUMMARY OF THE DISCLOSURE

In a first embodiment, a method is provided. The method comprises scanning a wafer with an inspection tool. Presence of at least one defect is confirmed with a defect review tool. Parameters are inputted into a deep learning model. The parameters include one or more of: a location of the defect with respect to one or more of a design, a care area, or a design clip; focus; exposure; a type of the defect; neighboring design sites; and a layer type. In an instance, the parameters also include optical proximity correction. Defect sites are predicted, using a controller, based on the deep learning model. The defect sites are validated. The deep learning model is optionally retrained. During retraining, the predicting, the validating, and the retraining are repeated until the deep learning model meets a detection accuracy threshold. The defect review tool may be a scanning electron microscope. The scan may be a hot scan.

A heat map of the defect sites can be generated.

The deep learning model can be used to predict defects on a new wafer. The deep learning model also can be used to predict defects for a new semiconductor manufacturing process on the wafer.

A non-transitory computer readable medium storing a program can be configured to instruct a processor to execute any of the variations of the method in the first embodiment.

In a second embodiment, a method is provided. The method comprises scanning a wafer with a scanning electron microscope. Using a controller, critical dimension variation is calculated across the wafer at sample sites. Parameters are inputted into a deep learning model. The parameters include one or more of: a location where critical dimension is measured with respect to one of a design, a care area, or a design clip; focus; exposure; neighboring design sites; and a layer type. In an instance, the parameters also include optical proximity correction. Critical dimension is predicted at sites across the wafer, using the controller, based on the deep learning model. The sites with different critical dimensions are validated. The deep learning model is optionally retrained. During retraining, the predicting, the validating, and the retraining are repeated until the deep learning model meets a detection accuracy threshold.

A heat map of critical dimension variation can be generated.

The deep learning model can be used to predict critical dimension on a new wafer. The deep learning model also can be used to predict critical dimension for a new semiconductor manufacturing process on the wafer.

A non-transitory computer readable medium storing a program can be configured to instruct a processor to execute any of the variations of the method in the second embodiment.

In a third embodiment, a system is provided. The system comprises a controller in electronic communication with a scanning electron microscope or with the scanning electron microscope and an optical inspection tool.

The controller includes a processor and an electronic data storage unit in electronic communication with the processor. The controller is configured to: receive results of a review of a wafer; input parameters in a deep learning model; predict additional results at sites across the wafer; receive validation of the results at the sites across the wafer; and optionally retrain the deep learning model. The results are one of defect locations or critical dimension. The parameters include one or more of: a location where the results are measured with respect to one of a design, a care area, or a design clip; focus; exposure; neighboring design sites; and a layer type. The additional results are the same as the one of the defect locations or the critical dimension. During retraining, the predict step, the validate step, and the retrain step are repeated until the deep learning model meets a detection accuracy threshold.

The system can further include a scanning electron microscope in electronic communication with the controller. The system also can further include an optical inspection tool and a scanning electron microscope in electronic communication with the controller.

The controller can be configured to generate a heat map of results variation.

The controller can be configured to use the deep learning model to predict results on a new wafer. The controller also can be configured to use the deep learning model to predict results for a new semiconductor manufacturing process on the wafer.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Techniques disclosed herein collect wafer data, such as with an initial hot spot inspection. Thus, an initial inspection or CD measurement can be made at various sites on the wafer. The wafer data can include defects or CD variation. The location, design clips, process tool parameters, or other parameters can be used to train a deep learning model, which is then used to predict across the wafer or a subsequent wafer. Visits to the predicted sites using inspection and review tools can validate the deep learning model and these results can be used to retrain the deep learning model. This process can be repeated until the predictions have an acceptable degree of accuracy. The deep learning model can be used to predict new probable defect location or CD failure sites.

With shrinking design rules, monitoring CD variation across a wafer at all process steps is becoming more important. Monitoring may help flag any CD variation crossing a threshold, which can prevent any mass scale damage to the wafer. This also may help prevent drifts in process during manufacturing.

Figure 1:
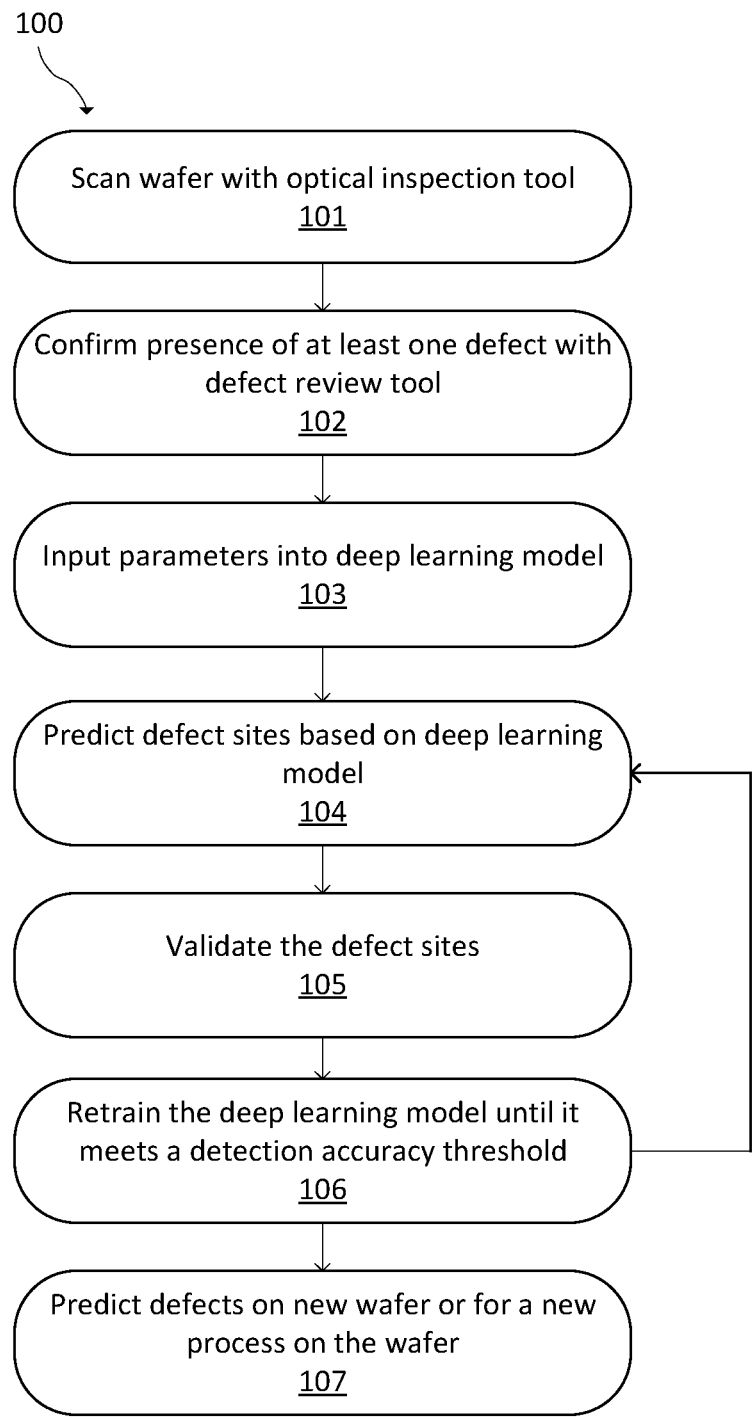
FIG. 1 is a flowchart illustrating an embodiment of a method in accordance with the present disclosure.

FIG. 1 is a flowchart illustrating a method 100. A wafer is scanned with an inspection tool, such as an optical inspection tool, at 101. Detecting defects on the wafer may involve using one or more optics modes including performing a hot scan on the wafer using the one or more optics modes. A "hot scan" generally refers to a measurement/inspection of a wafer performed to detect defects or take measurements on the wafer by applying relatively aggressive detection settings (e.g., thresholds substantially close to the noise floor). In this manner, the hot scan may be performed to collect inspection or measurement data about the wafer that will be used for other steps disclosed herein. The goal of the hot scan is to measure a representative sample of all CD measurements or detect a representative sample of all defect and nuisance types on the wafer in the selected mode(s).

The presence of at least one defect is confirmed at 102 with a defect review tool, which may be an SEM or another device. Sampling may be performed to confirm the presence of the at least one defect.

Parameters are inputted into a deep learning model at 103. The parameters can include one or more of a location of the defect with respect to at least one of a design, a care area, or a design clip; tool parameters (e.g., focus, exposure); a type of the defect; neighboring design sites; a layer type; or optical proximity correction. The neighboring design sites can be used to determine what kind of design files can lead to defects.

With respect to the parameters, defect location may be with respect to a die corner. The defect location also can be referenced to a wafer coordinate system or to a die index with respect to a wafer coordinate system. The defect type may be the type of defect, such as a particle, void, short, bridge or any other general types of defect. The neighboring design sites may be any specific shape or pattern of the design (e.g., T-shape or other critical shape), and may be or may not be related to density. The layer type may be a CMP layer, an etch layer, or other layers on the wafer.

Defect sites are predicted based on the deep learning model, which has been trained, at 104. The predicting 104 may be performed by a controller. The defect sites are validated at 105, such as with a defect review tool like an SEM or another device. The validating can be performed to confirm presence of a defect at the defect site. Wafer data can be collected at the defect sites. For example, SEM images are collected at the defect sites.

In an instance, the deep learning model can use TensorFlow, which was originally developed by the Google Brain team. TensorFlow is a software library for numerical computation using data flow graphs. Graph nodes represent mathematical operations, while the graph edges represent the multidimensional data arrays (tensors) that flow between them. Other mathematical libraries for general machine learning applications and neural networks can be used besides TensorFlow and TensorFlow is merely one example.

In an instance, the deep learning model is only retrained with positive data and negative data is removed.

If necessary, the deep learning model is retrained at 106. The predicting 104, validating 105, and retraining 106 can be repeated until the deep learning model meets a detection accuracy threshold. Wafer data from the validating at 104 can be inputted into the deep learning model. In an instance, no retraining is necessary because the deep learning model meets the detection accuracy threshold based on results of the initial predicting 104. The detection accuracy threshold can be set as per semiconductor manufacturer requirements. The detection accuracy threshold may be determined by a nuisance rate desired by a semiconductor manufacturer. The smaller nuisance then the tighter is the threshold. For example, if the semiconductor manufacturer wants a nuisance rate of 20% to 30% out of the 100 sites sampled, then the detect accuracy threshold may be set to meet these requirements.

At 107, the deep learning model can be used to predict defects on a new wafer and/or predict defects for a new semiconductor manufacturing process on the wafer. The input to the deep learning model may be the same as used for training or retraining. The deep learning model should be able to predict the defects and/or CD measurements. If any changes are made to any of the parameters, those parameters may be inputted to the deep learning model to provide accurate predictions.

The method 100 can further include generating a heat map of the defect sites. The heat map can illustrate possible defects and the type of defect on the wafer map.

Figure 2:
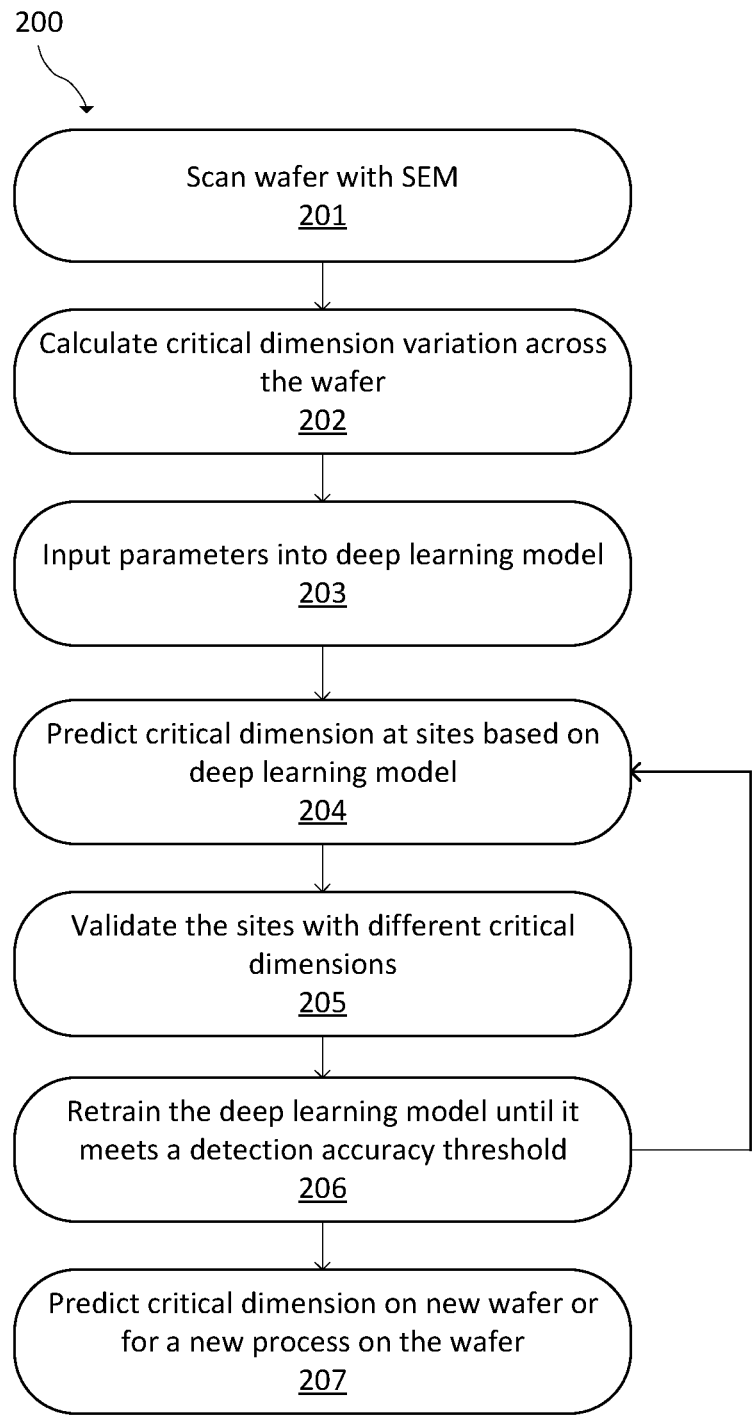
FIG. 2 is a flowchart illustrating another embodiment of a method in accordance with the present disclosure.

FIG. 2 is a flowchart illustrating a method 200. A wafer is scanned with an SEM at 201. The CD variation across the wafer at sample sites is calculated at 202. This may be performed by a controller.

Parameters are inputted into a deep learning model at 203. The parameters can include one or more of a location where CD is measured with respect to at least one of a design, a care area, or a design clip; tool parameters (e.g., focus, exposure); a type of the defect; neighboring design sites; a layer type; or optical proximity correction. The neighboring design sites can be used to determine what kind of design files can lead to defects.

CD at sites across the wafer is predicted at 204 based on the deep learning model, which has been trained. The predicting 204 may be performed by a controller. The sites with different CDs are validated at 205, such as with an SEM or another device. The validating can be performed to confirm CD at the sites. Wafer data can be collected at the sites. In an instance, SEM images needs to be collected at those sites to confirm the presence of defects. Wafer data can refer to CD measurement data using SEM images, which can be collected at those sites to confirm the quantum of CD variation.

If necessary, the deep learning model is retrained at 206. The predicting 204, validating 205, and retraining 206 can be repeated until the deep learning model meets a detection accuracy threshold. Wafer data from the validating at 204 can be inputted into the deep learning model. In an instance, no retraining is necessary because the deep learning model meets the detection accuracy threshold based on results of the initial predicting 204.

At 207, the deep learning model can be used to predict CD on a new wafer and/or predict CD for a new semiconductor manufacturing process on the wafer.

The method 100 can further include generating a heat map of the defect sites. The heat map can illustrate CD variation on the wafer map.

The method 100 and the method 200 use deep learning models to predict probable defect locations or CD measurements on a wafer. This can help find probable defect locations during semiconductor manufacturing. A reduction in nuisance rate is one of the biggest challenges in defect inspection because it reduces the inspection review cycle for finding critical DOI locations. Furthermore, heat maps of defects and/or CDs can be provided. This can improve process monitoring.

The method 100 and the method 200 use actual wafer data points and additional parameters. A small sample set may be used for the initial prediction.

Figure 3:
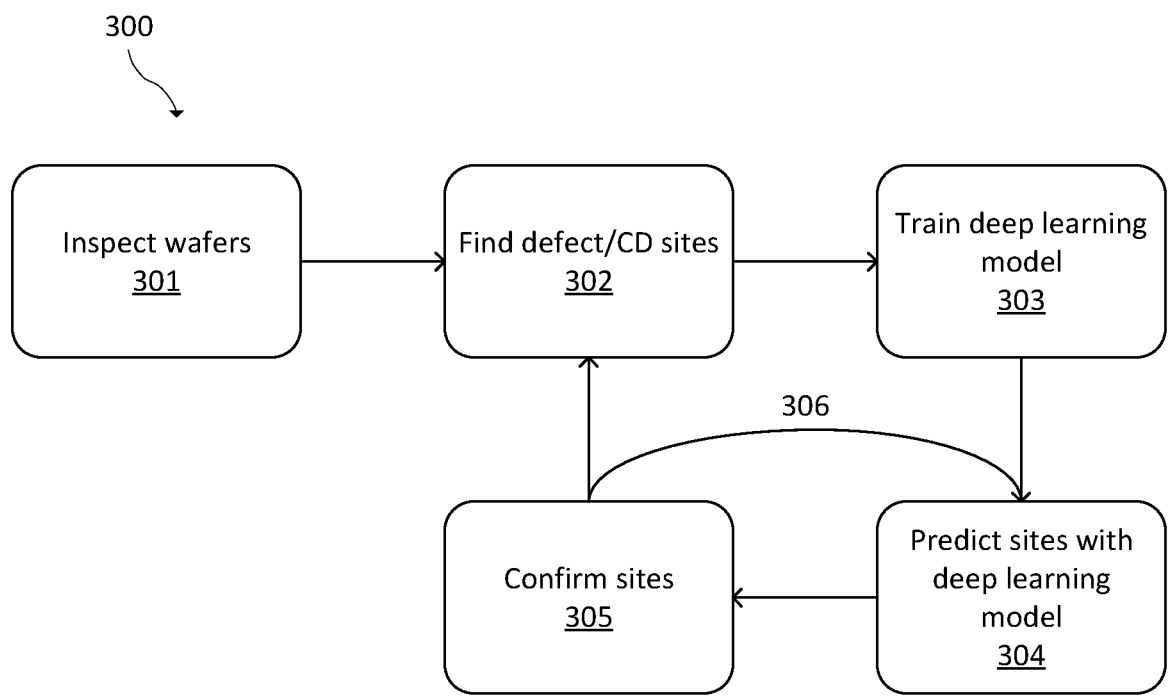
FIG. 3 is a flowchart of an example of the methods disclosed herein.

FIG. 3 is a flowchart 300 of an example of the methods disclosed herein. Wafers are inspected with an inspection tool, such as an optical inspection tool, at 301. Defect or CD sites can be found at 302, such as using an SEM. The defect or CD type also can be determined at 302. The deep learning model is trained at 303, such as with the location, defect type, and manufacturing tool parameters as inputs. Sites with defects or CD failures are predicted with the deep learning model at 304 and confirmed at 305. Confirming the sites 305 can include revisiting the sites with the SEM, such as at 302, which can be used to further train the deep learning model. The deep learning model can optionally be retrained as shown in 306.

Figure 4:
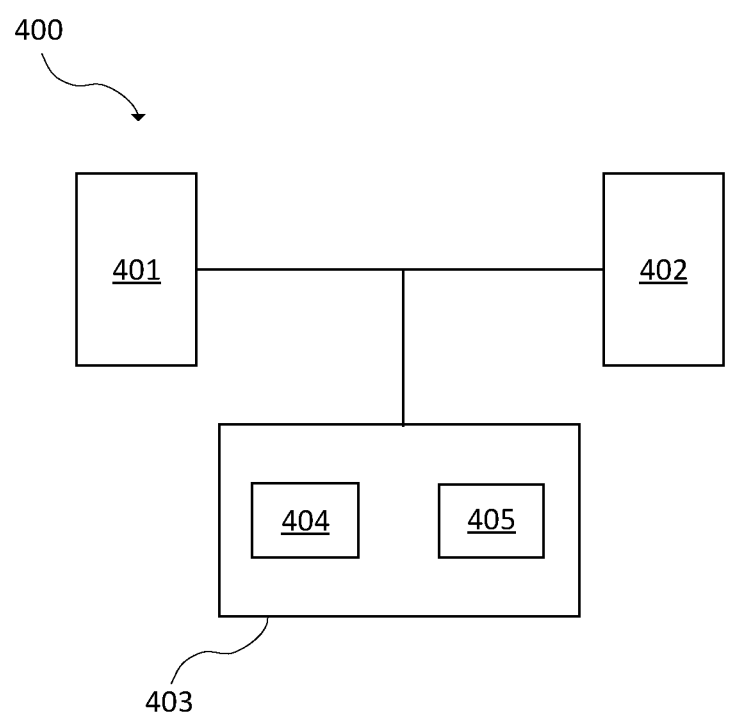
FIG. 4 is a system drawing of a system used in conjunction with the embodiments of the present disclosure.

FIG. 4 is a system drawing of a system 400. The system 400 includes an optical inspection tool 401, a defect review tool 402, and a controller 403 with a processor 404 and an electronic data storage unit 405 in electronic communication with the processor 404. The defect review tool 402 may be an SEM. The wafer inspection tool 401 may be a BBP inspection tool, which can be configured to perform a hot scan to capture inspection results. The wafer inspection tool 401 also may be an electron beam tool or a laser scanning tool. The controller 403 is in electronic communication with the optical inspection tool 401 and the defect review tool 402.

The controller 403 may be part of the optical inspection tool 401 or the defect review tool 402, or another device. In an example, the controller 403 may be a standalone control unit or in a centralized quality control unit. Multiple controllers 403 may be used.

The controller 403 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 403 to implement various methods and functions may be stored in controller readable storage media, such as a memory in the electronic data storage unit 405 or other memory.

The controller 403 can be configured to receive wafer data. The wafer data are one of defect locations or CD and may be generated by, for example, the defect review tool 402 or the optical inspection tool 401. Parameters are inputted in a deep learning model. The parameters include one or more of a location where the results are measured with respect to one of a design, a care area, or a design clip; tool parameters (e.g., focus, exposure); a type of the defect; neighboring design sites; a layer type; or optical proximity correction. Additional results are predicted at sites across the wafer. The additional results are the same as the one of the defect locations or the CD, meaning that if defect locations are received then defect locations will be predicted and if CD results are received then CD results will be predicted. The controller 403 receives validation of results at the sites across the wafer. Thus, the additional results may be confirmed. If necessary, the deep learning model is retrained. Predicting, receiving validation, and retraining can be repeated until the deep learning model meets a detection accuracy threshold.

The controller can be configured to use the deep learning model to predict results on a new wafer or for a new semiconductor manufacturing process on the wafer. With new semiconductor processes, a new set of parameters can be inputted to the deep learning model to determine if predictions are accurate.

The controller 403 also can be configured to generate a heat map of results variation.

The system 400 can include an SEM 402 in electronic communication with the controller 403 or both an optical inspection tool 401 and an SEM 402 in electronic communication with the controller 403. While illustrated with both an optical inspection tool 401 and an SEM 402, the system 400 may only include an SEM 402 in electronic communication with the controller 403. The controller 403 may be part of the optical inspection tool 401 or the SEM 402.

The controller 403 may be coupled to the components of the system 400 in any suitable manner (e.g., via one or more transmission media, which may include wired and/or wireless transmission media) such that the controller 403 can receive the output generated by the system 400. The controller 403 may be configured to perform a number of functions using the output.

The controller 403, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a controller for performing a computer-implemented defect detection or CD analysis, as disclosed herein. In particular, the processor 404 can be coupled to a memory in the electronic data storage unit 405 or other electronic data storage medium with non-transitory computer-readable medium that includes program instructions executable on the processor 404. The computer-implemented method may include any step(s) of any method(s) described herein. For example, the controller 403 may be programmed to perform some or all of the steps of FIG. 1, FIG. 2, or FIG. 3, which can be executed by the processor 404. The memory in the electronic data storage unit 405 or other electronic data storage medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as ICs may be formed on a wafer, and the term wafer as used herein is intended to encompass a wafer on which any type of device known in the art is being fabricated. As used herein, the term "chip" may comprise a collection of ICs designed for a particular purpose.

Although embodiments are described herein with respect to wafers, it is to be understood that the embodiments may be used for another specimen such as a reticle, which may also be commonly referred to as a mask or a photomask. Many different types of reticles are known in the art, and the terms "reticle," "mask," and "photomask" as used herein are intended to encompass all types of reticles known in the art.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A method comprising:
    scanning a wafer with an inspection tool;
    confirming presence of at least one defect with a defect review tool, wherein the confirming includes sampling defects;
    inputting parameters into a deep learning model, wherein the parameters include a location of the defect with respect to one or more of a design, a care area, or a design clip and wherein the parameters optionally further include one or more of:
        focus;
        exposure;
        a type of the defect;
        neighboring design sites; and
        a layer type;
    predicting defect sites, using a controller, after the inputting based on the deep learning model;
    collecting images of the defect sites predicted by the deep learning model;
    validating the defect sites, wherein the validating includes confirming a presence of at least one defect at the defect sites in the images; and
    retraining the deep learning model with wafer data from the validating, wherein the predicting, the validating, and the retraining are repeated until the deep learning model meets a detection accuracy threshold.

2. The method of claim 1, wherein the scan is a hot scan.

3. The method of claim 1, wherein the defect review tool is a scanning electron microscope.

4. The method of claim 1, wherein the parameters further include optical proximity correction.

5. The method of claim 1, further comprising generating a heat map of the defect sites.

6. The method of claim 1, further comprising using the deep learning model to predict defects on a new wafer.

7. The method of claim 1, further comprising using the deep learning model to predict defects for a new semiconductor manufacturing process on the wafer.

8. A non-transitory computer readable medium storing a program configured to instruct a processor to execute the method of claim 1.

9. A method comprising:
    scanning a wafer with a scanning electron microscope;
    calculating, using a controller, critical dimension variation across the wafer at sample sites;
    inputting parameters into a deep learning model, wherein the parameters include a location where critical dimension is measured with respect to one of a design, a care area, or a design clip and wherein the parameters optionally further include one or more of:
        focus;
        exposure;
        neighboring design sites; and
        a layer type;
    predicting the critical dimension at sites across the wafer after the inputting, using the controller, based on the deep learning model;
    collecting images of the sites from the deep learning model;
    validating the critical dimension at the sites, wherein the validating includes confirming the critical dimension at the sites in the images; and
    retraining the deep learning model with wafer data from the validating, wherein the predicting, the validating, and the retraining are repeated until the deep learning model meets a detection accuracy threshold.

10. The method of claim 9, wherein the parameters further include optical proximity correction.

11. The method of claim 9, further comprising generating a heat map of critical dimension variation.

12. The method of claim 9, further comprising using the deep learning model to predict critical dimension on a new wafer.

13. The method of claim 9, further comprising using the deep learning model to predict critical dimension for a new semiconductor manufacturing process on the wafer.

14. A non-transitory computer readable medium storing a program configured to instruct a processor to execute the method of claim 9.

15. A system comprising:
    a controller in electronic communication with a scanning electron microscope or with the scanning electron microscope and an optical inspection tool, wherein the controller includes a processor and an electronic data storage unit in electronic communication with the processor, and wherein the controller is configured to:
        receive results of a review of a wafer, wherein the results are one of defect locations or critical dimension;
        input parameters in a deep learning model, wherein the parameters include a location where the results are measured with respect to one of a design, a care area, or a design clip and wherein the parameters optionally further include one or more of:
            focus;
            exposure;
            neighboring design sites; and
            a layer type;
        predict additional results at sites across the wafer after the inputting, wherein the additional results are the same as the one of the defect locations or the critical dimension;
        receive collected images of the sites from the deep learning model;
        receive validation of the results at the sites across the wafer, wherein the validation confirms a presence of the additional results at the defect sites in the images; and
        retrain the deep learning model with wafer data from the validating, wherein the predict step, the validate step, and the retrain step are repeated until the deep learning model meets a detection accuracy threshold.

16. The system of claim 15, further comprising the scanning electron microscope in electronic communication with the controller.

17. The system of claim 15, further comprising the optical inspection tool and the scanning electron microscope in electronic communication with the controller.

18. The system of claim 15, wherein the controller is configured to generate a heat map of results variation.

19. The system of claim 15, wherein the controller is configured to use the deep learning model to predict results on a new wafer.

20. The system of claim 15, wherein the controller is configured to use the deep learning model to predict results for a new semiconductor manufacturing process on the wafer.

* * * * *